United States Patent
Wallis (10) Patent No.: US 9,019,853 B2
(45) Date of Patent: Apr. 28, 2015

(54) PROCESS FOR PERFORMING CUBIC METRIC COMPUTATION IN THE TRANSMITTER OF A UE FOR A WIRELESS COMMUNICATION SYSTEM, AND APPARATUS FOR PERFORMING THE SAME

(75) Inventor: Mark A. Wallis, Mouans Sartoux (FR)

(73) Assignee: ST-Ericsson SA, Plan-les-Ouates (CH)

( * ) Notice: Subject to any disclaimer, the term of this patent is extended or adjusted under 35 U.S.C. 154(b) by 205 days.

(21) Appl. No.: 13/578,953

(22) PCT Filed: Feb. 14, 2011

(86) PCT No.: PCT/EP2011/000681
§ 371 (c)(1),
(2), (4) Date: Oct. 10, 2012

(87) PCT Pub. No.: WO2011/098296
PCT Pub. Date: Aug. 18, 2011

(65) Prior Publication Data
US 2013/0279351 A1    Oct. 24, 2013

(30) Foreign Application Priority Data

Feb. 15, 2010 (EP) .................................. 10368014

(51) Int. Cl.
*H04W 24/02* (2009.01)
*H04B 1/707* (2011.01)
(Continued)

(52) U.S. Cl.
CPC ............. *H04W 24/02* (2013.01); *H03G 3/3042* (2013.01); *H04B 1/707* (2013.01); *H04W 52/286* (2013.01); *H04W 52/52* (2013.01); *Y02B 60/50* (2013.01)

(58) Field of Classification Search
CPC ..... H03G 3/3042; H04B 1/707; H04W 24/02; H04W 52/286; H04W 52/52; Y02B 60/50
USPC .......................................................... 370/252
See application file for complete search history.

(56) References Cited

U.S. PATENT DOCUMENTS 5,999,561 A * 12/1999 Naden et al. .................. 375/142
6,556,618 B1 * 4/2003 Morsberger et al. .......... 375/146
(Continued)

FOREIGN PATENT DOCUMENTS

WO   WO 2009/153138    *   5/2009   ............. H04B 1/707
WO       2009153138 A1    12/2009

OTHER PUBLICATIONS

3rd Generation Partnership Project; Technical Specification Group Radio Access Network; Feasibility Study on Synchronised E-DCH for UTRA FDD (Release 8); 3GPP Draft; R1-081151, 3rd Generation Partnership Project (3GPP), Mobile Competence Centre; 650, Route Des Lucioles, F-06921 Sophia-Antipolis Cedex, France; vol. RAN WG1, no. Sorrento, Italy; Feb. 20, 2008 XP050109588.

*Primary Examiner* — Andrew Lai
*Assistant Examiner* — Mahmudul Hasan
(74) *Attorney, Agent, or Firm* — Coats & Bennett, PLLc (57) ABSTRACT

A process for computing cubic metric used for performing Maximum Power Reduction (MPR) in the transmitter of a User Equipment communicating with a base station (BS), said cubic metric computation being performed before each time slot of said uplink transmission of data; said process being characterized in that it involves the steps of: —using PN generators (1-4) for generating random data which are used for performing said cubic metric computation, and —using the result of said computation for applying said Maximum Power Reduction (MPR) for each time slot of said uplink transmission.

8 Claims, 7 Drawing Sheets

(51) Int. Cl.
*H04W 52/28* (2009.01)
*H04W 52/52* (2009.01)
*H03G 3/30* (2006.01)

(56) References Cited

U.S. PATENT DOCUMENTS

| | | |
|---|---|---|
| 2002/0036996 A1* | 3/2002 | Ozluturk et al. .............. 370/335 |
| 2005/0100102 A1* | 5/2005 | Gazdzinski et al. .......... 375/242 |
| 2006/0068745 A1* | 3/2006 | Wei ................................ 455/323 |
| 2008/0305824 A1* | 12/2008 | Haim et al. .................... 455/522 |
| 2010/0034186 A1* | 2/2010 | Zhou et al. ..................... 370/344 |
| 2010/0150126 A1* | 6/2010 | Scholand et al. ............. 370/342 |
| 2010/0153049 A1* | 6/2010 | Ventola et al. .................. 702/86 |
| 2010/0210255 A1* | 8/2010 | Amirijoo et al. .............. 455/419 |
| 2010/0239031 A1* | 9/2010 | Wallen .......................... 375/260 |
| 2010/0296605 A1* | 11/2010 | Sundstrom et al. ........... 375/296 |
| 2010/0308909 A1* | 12/2010 | Verma et al. .................. 330/131 |

* cited by examiner

Spreading factors and codes

| Channel | Spreading factor | OVSF code number |
|---|---|---|
| DPCCH | 256 (fixed in HW) | 0 (fixed in HW) |
| DPDCH | 4-256 | SF/4 |
| HS-DPCCH | 256 (fixed in HW) | 33 or 64 |
| E-DPCCH | 256 (fixed in HW) | 1 (fixed in HW) |
| E-DPDCH1 | 2-256 | SF/2 or SF/4 |
| E-DPDCH2 | 2 or 4 | 2 or 1 |
| E-DPDCH3 | 4 (fixed in HW) | 1 (fixed in HW) |
| E-DPDCH4 | 4 (fixed in HW) | 1 (fixed in HW) |

PROCESS FOR PERFORMING CUBIC METRIC COMPUTATION IN THE TRANSMITTER OF A UE FOR A WIRELESS COMMUNICATION SYSTEM, AND APPARATUS FOR PERFORMING THE SAME

TECHNICAL FIELD

The invention relates to the field of wireless digital communications and more particularly to a process for performing cubic metric computation in the transmitter of a UE for a wireless communication system, and apparatus for performing the same

BACKGROUND ART

Nowadays, extensive research is being performed in the field of wireless communications for improving wireless networks all around the world. The 3GPP Long Term Evolution (LTE) that is the last step toward the 4th generation (4G) of wireless communication systems, is focusing in improving the capacity and speed of wireless networks.

A wireless communication system includes a base station (BS) and a User Equipment (UE) consisting of a receiver for receiving radio signal from the base station in the downlink and a transmitter for transmitting radio signal to the base station in the uplink.

A radio transmission chain of a UE includes a power amplifier (PA) for amplifying the signal before it is transmitted through the channel. The power amplifier has an approximately constant gain that is defined by the ratio of output to input power of the amplifier and is measured in decibels.

However, in certain modulation schemes of the radio signal, the peak to average power ratio (PAPR) of the signal may be high. Specifically, the PAPR is a measurement of a waveform of the signal, calculated from the peak amplitude of the waveform divided by the Root Mean Square (RMS) value of the waveform.

A high PAPR might result in saturation of the power amplifier and accordingly to distortion of its output signal peaks. In turn, this distortion provokes increased channel interference and noise.

A known solution to this problem is the so-called Maximum Power Reduction (MPR). Specifically, MPR reduces the maximum average transmit power at which the transmitter of the UE is able to transmit, any time that the transmit signal has high peak to average power ratio.

In prior art, maximum power reduction can be performed by applying a fixed reduction according to mode (High-Speed Uplink Packet Access (HSUPA), High-Speed Downlink Packet Access (HSDPA) etc).

Another way for performing maximum power reduction (MPR) is according to a metric defined as the root mean square of the cube of the instantaneous transmit signal power Tx. In the 3GPP standard, this metric is called a "cubic metric".

Several attempts have been made in order to estimate the cubic metric (CM) based on software look-up tables grouping values of parameters which yield the same CM (rounded to 0.5 dB).

Such solutions seem unworkable due to the high number of parameters involved (channel weighting coefficients, spreading factor) and also the large range of each parameter The problem lies on the fact that, in order to avoid any excessive distortion of the power amplifier during the entire transmission, the MPR and thus the cubic metric needs to be determined prior to the start of uplink transmission, and thus when the data to transmit is available.

In the case of the 3G, the uplink transmission is divided into timeslots but is continuous. For each timeslot, the parameters which influence the cubic metric can change at a slot boundary, but remain constant during each timeslot. In particular, the above mentioned parameters include channel weighting coefficients, channel spreading factors and spreading codes (OVSF) as well as IQ mapping.

In many cases, the data to be transmitted in a given timeslot is not available until the start of that timeslot. This means that the cubic metric can not be directly measured on the signal transmission and in a suitable time to determine the maximum power reduction.

Accordingly, there is a need of computing the cubic metric before the signal transmission, and particularly without requiring too extensive data processing.

SUMMARY OF THE INVENTION

It is an object of the present invention to provide a process and a receiver for a wireless communication network, which achieves effective cubic metric computation associated to the transmission of real data, preliminary to the receipt of user data.

It is another object of the present invention to provide a process for computation of a cubic metric in a UE, which computation does not require too much power.

It is still a further object of the present invention to achieve User Equipment incorporating more efficient Maximum Power Reduction (MPR) processes.

These and other objects are achieved by a process for computing cubic metric used for performing Maximum Power Reduction (MPR) in the transmitter of a User Equipment communicating with a base station (BS). The cubic metric is computed before the actual transmission of the user's data through the uplink transmission.

The process involves the steps of:
using PN generators for generating random data which are used for performing said cubic metric computation, and
using the result of said computation for applying said Maximum Power Reduction (MPR) for each time slot of said uplink transmission.

Preferably, the process involves the steps of:
generating at least one random signal by using Pseudorandom Number (PN) generators, said random signal being equivalent to the real signal;
spreading the generated random signal to associated channels;
weighting the spread random signal by gain factors $\beta$;
mapping the weighted random signal in I and Q channels;
scrambling the mapped random signal by a complex (valued scrambling code) so as to provide a complex chip stream;
normalizing the complex chip stream
upsampling and filtering the normalized complex chip stream;
performing Cubic Metric (CM) calculation of the normalized complex chip stream, by calculating $(V_{norm})^3{}_{RMS}$
where $(V_{norm})_{RMS}$ is the Root Mean Square of a normalized voltage waveform of the complex chip stream.

In one embodiment, the Maximum Power Reduction (MPR) is applied in HSUPA (High-Speed Uplink Packet Access). Alternatively, it is applied in High-Speed Downlink Packet Access (HSDPA).

The process is likely to be adapted for future Long Term Evolution (LTE) communication systems.

The invention also achieves a receiver for a User Equipment (UE) for a wireless communication network, where the receiver includes a transmitter which performs cubic metric computation for the purpose of applying Maximum Power Reduction (MPR) based on the following features:
- a set of PN generators for generating random data which are used for performing said cubic metric computation, and
- Cubic metric computing means receiving the random data generated by said PN generators so as to perform a cubic metric computation on said random data which will be used at the next time slot for the transmission to the base station of actual is data.

In one embodiment the receiver particularly includes:
- means for generating at least one random signal by using Pseudorandom Number (PN) generators, said random signal being equivalent to the real signal;
- means for spreading the generated random signal to associated channels;
- means for weighting the spread random signal by gain factors β;
- means for mapping the weighted random signal in I and Q channels;
- means for scrambling the mapped random signal by a complex (valued scrambling code) so as to provide a complex chip stream;
- means for normalizing the complex chip stream;
- means for upsampling and filtering the normalized complex chip stream;
- means for performing Cubic Metric (CM) calculation of the normalized complex chip stream, by calculating $(V_{norm})^3{}_{RMS}$ where $(V_{norm})_{RMS}$ is the Root Mean Square of a normalized voltage waveform of the complex chip stream.

The receiver is particularly adapted to the design of a User Equipment for a wireless telecommunication network.

DESCRIPTION OF THE DRAWINGS

Other features of one or more embodiments of the invention will best understood by reference to the following detailed description when read in conjunction with the accompanying drawings.

DESCRIPTION OF THE PREFERRED EMBODIMENT

Figure 1:
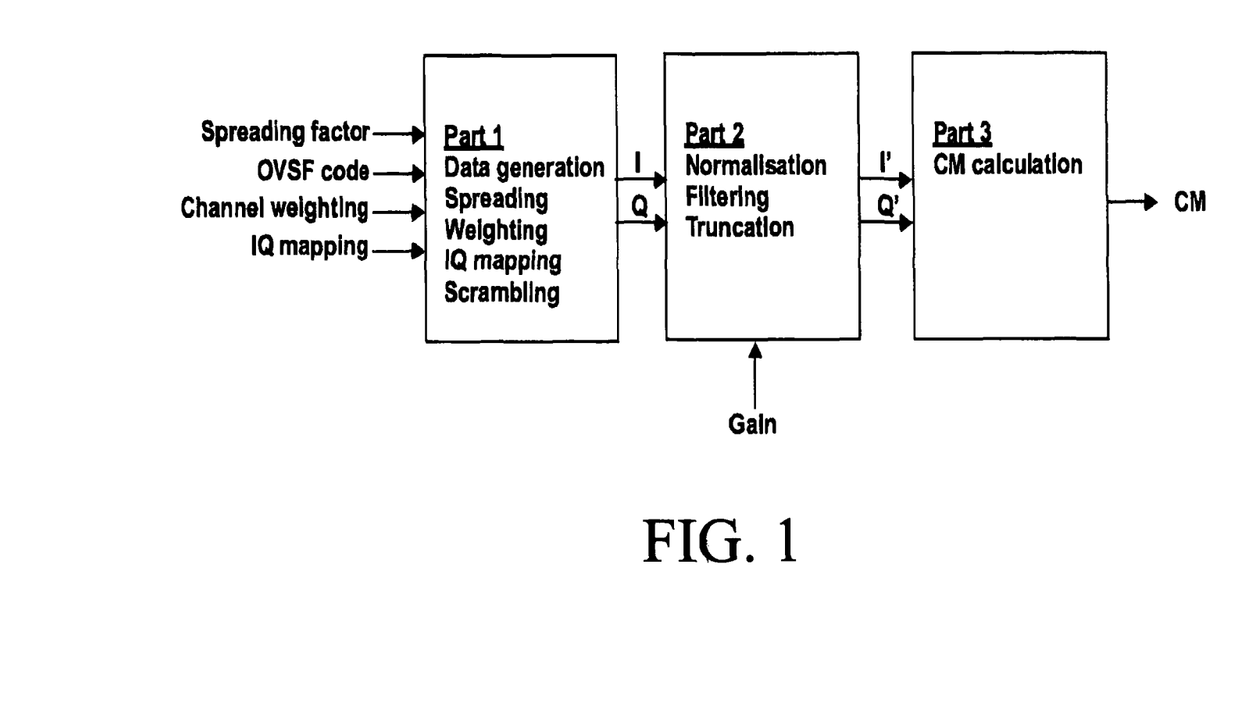
FIG. 1 particularly shows the different parameters used for the calculation of the cubic metric in one embodiment.
Figure 2:
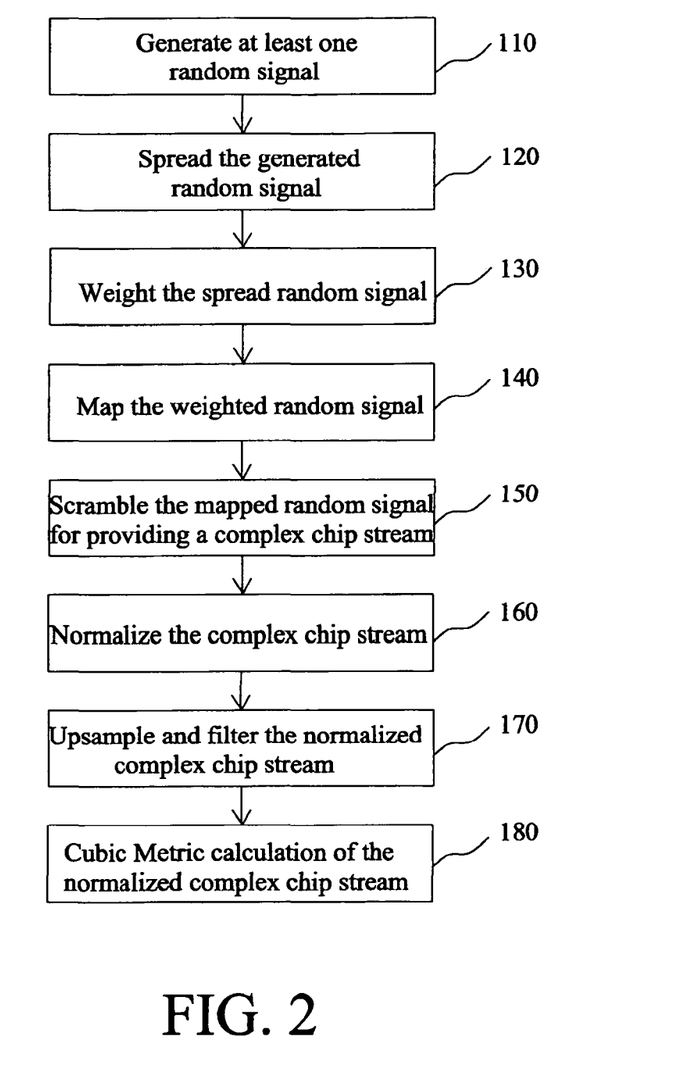
FIG. 2 illustrates one embodiment of a process for computing the cubic metric.

With respect to FIG. 2, taken in combination with FIG. 3-7, there will now be described a preferred embodiment of a process for performing Cubic Metric computation for a signal transmission in the uplink between a User Equipment (UE) and a base station (BS). The CM computation is performed before the beginning of each timeslot of the signal transmission in order to perform Maximum Power Reduction (MPR) for each timeslot of the signal transmission.

The reason for performing MPR for each timeslot of the signal transmission is to control the transmission power of the UE for each time slot, in order to prevent any saturation of the power amplifier of the UE.

Maximum Power Reduction (MPR) is applied in HSUPA (High-Speed Uplink Packet Access), and/or High-Speed Downlink Packet Access (HSDPA) and/or Long Term Evolution (LTE). Specifically for rel 99, the MPR is always zero.

Figure 3:
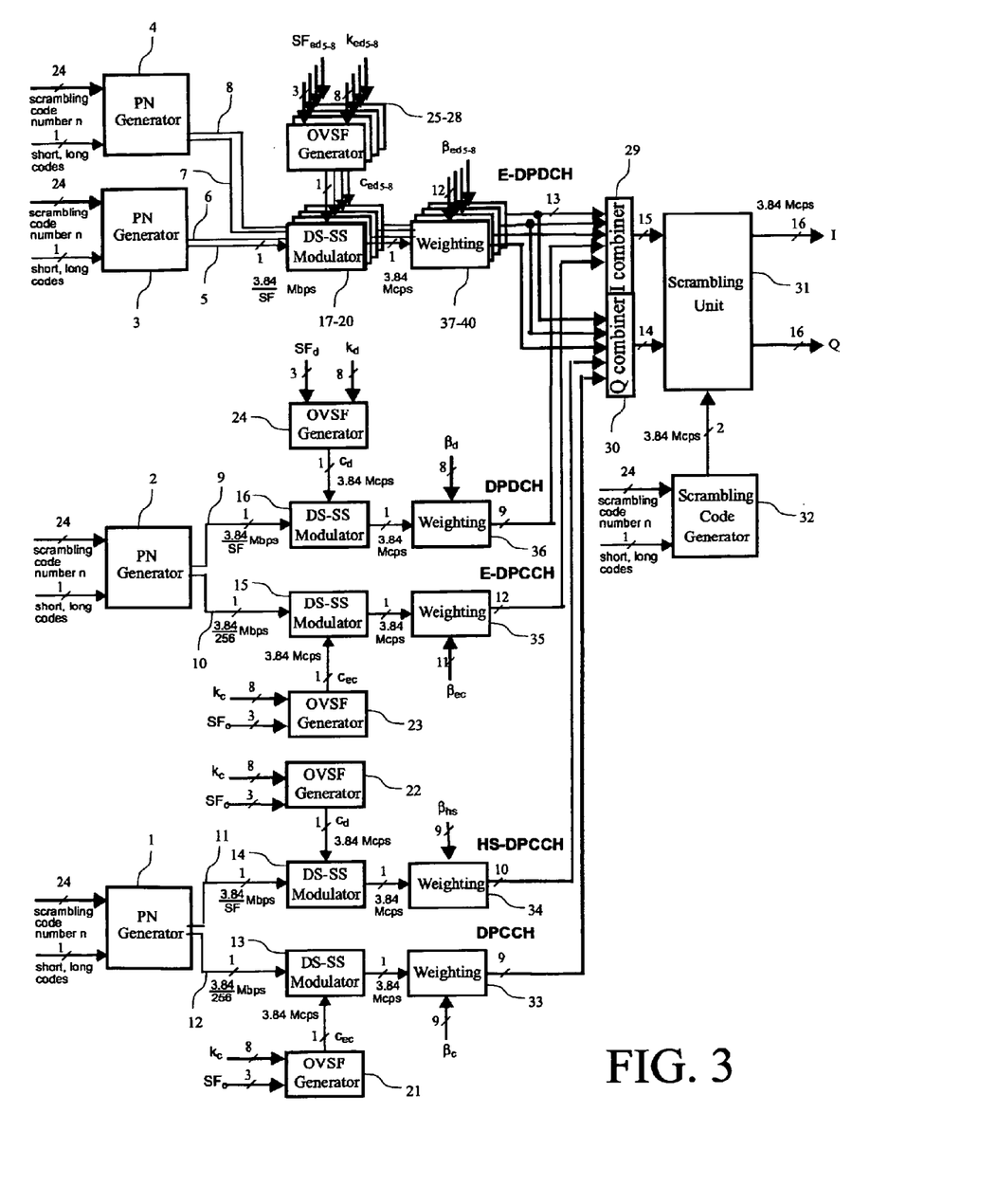
FIG. 3 illustrates one embodiment of an architecture suitable for performing the process of FIG. 2.

In the preferred embodiment of the invention we have eight communication channels which are shown in FIG. 3 and are the following: Dedicated Physical Control Channel 12 (DPCCH), Dedicated Physical Data Channel 9 (DPDCH), Uplink High Speed-Dedicated Physical Control Channel 11 (HS-DPCCH), Enhanced Dedicated Physical Control Channel 10 (E-DPCCH), Enhanced Dedicated Physical Control Channel 5 (E-DPDCH5), Enhanced Dedicated Physical Control Channel 6 (E-DPDCH6), Enhanced Dedicated Physical Control Channel 7 (E-DPDCH7), Enhanced Dedicated Physical Control Channel 8 (E-DPDCH8).

In a step 110 of the process, a random signal (or data) is generated by at least one Pseudorandom Number (PN) generator. The random signal is generated so as to show statistically equivalent parameters with respect to the real signal transmitted between the UE and the BS and for which the cubic metric is to be computed.

The above mentioned real signal is available just before the start of each timeslot and thus too late to be used in the Cubic Metric computation. However, provided that the calculation is performed over enough samples, and the data per channel is uncorrelated, the spreading and scrambling steps evoked below sufficiently randomize the signal so that the statistics, including the cubic metric, are data independent. In that way, the random signal can replace the real signal for the purpose of achieving Cubic Metric computation.

Preferably, as shown in FIG. 3, four PN generators 1-4 are used to provide the random signal. The PN generators are identical to the scrambling code generator used in the Baseband Transmission (BBTX).

The PN generators are configured to generate four different long scrambling codes.

In particular, PN generator 1 is configured with a first scrambling code (code number 1) and supplies dummy signal for DPCCH and HS-DPCCH channels (operating at 3.84 Mbps). PN generator 2 is configured with a second scrambling code (code number 2) and supplies dummy signal for E-DPCCH and DPDCH channels. PN generator 3 is configured with a third scrambling code (code number 3) and supplies dummy signal for E-DPDCH5 and E-DPDCH6, while PN generator 4 is configured with a fourth scrambling code (code number 4) and supplies dummy signal for E-DPDCH7 and E-DPDCH8.

The clocking of PN generator may be performed at any rate. Preferably, all generators are clocked at a rate superior to the chip rate, e.g. at 4× chip rate (15.36 MHz) and they generate two 1-bit output values for each cycle. Specifically, each PN generator can be used to supply random signal for two channels, and four generators are required to support all eight uplink channels.

The output bit-streams that represent the random signal generated by the PN generators, are sampled and held at a random signal-chip rate, namely $SF_i$, where $SF_i$ is the spreading factor for each associated channel i.

In a step 120, the process proceeds with spreading the random signal generated by the PN generators into the eight channels. Specifically, eight Direct Sequence-Spread Spectrum (DS-SS) modulators 13-20 illustrated in FIG. 3 are used for spreading the random signal into the eight channels.

Each of the DS-SS modulators 13-20 uses the spreading factors and Orthogonal Variable Spreading Factor (OVSF) codes provided by OVSF generators 21-28. As illustrated in FIG. 3, channels DPCCH 12, HS-DPCCH 11 and E-DPCCH 10 have OVSF and spreading factor $k_C$ and $SF_c$ respectively. Also, channel DPDCH 9 has spreading factor $SF_d$ and OVSF $k_d$ while channels E-DPDCH 5-8 have spreading factors $SF_{ed5-8}$ and OVSF $k_{ed5-8}$.

All the DS-SS modulators 13-20 are clocked at 4× chip rate (15.36 MHz), similar to the chip rate of the PN generators 1-4. Also, the modulation performed by DS-SS Modulators 13-20 is equivalent to that performed on the useful data in the BBTX.

Figure 4:
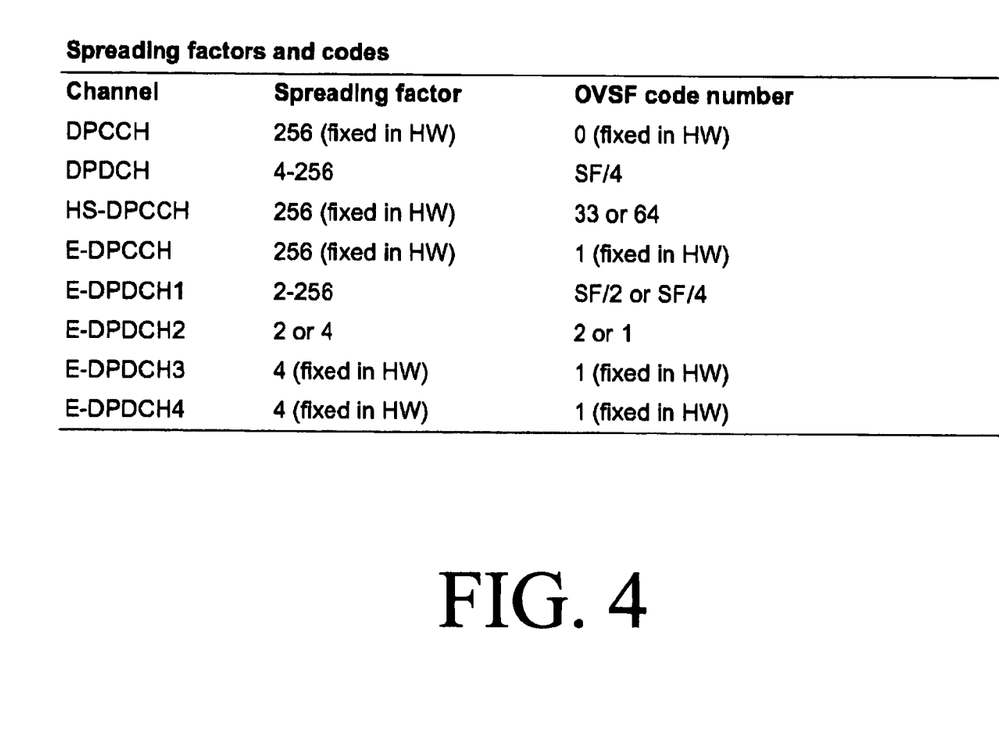
FIG. 4 is a table illustrating the spreading factors and codes.

FIG. 4 shows the spreading factors and Orthogonal Variable Spreading Factor (OVSF) codes for each of the eight channels.

In a step 130, the process proceeds with weighting the spread dummy signal by the following gain factors: $\beta_c$ for DPCCH 12 and control part of Physical Random Access CHannel message; $\beta_d$ for DPDCH 9 and data part of PRACH message; $\beta_{HS}$ for HS-DPCCH 11; $\beta_{EC}$ for E-DPCCH 10; and $\beta_{ED5-8}$ for E-DPDCH 5-8.

The weighting is equivalent to the particular weighting process which is applied to the useful data in the BBTX and is performed by weighting units 33-40. Also, in case that a channel is disabled, its gain factor should be set to zero.

In a step 140, the process proceeds with the mapping of the channels containing the weighted random signal onto I combiner 29 and/or Q combiner 30 and combining said random signal with other similar mapped signals of other similarly mapped channels.

As shown in FIG. 3, the channels E-DPDCH7 and E-DPDCH8 can be mapped onto the I combiner 29 or the Q combiner 30, depending on whether a DPDCH or a HS-DPCCH is enabled. All other channels have a fixed mapping.

Figure 5:
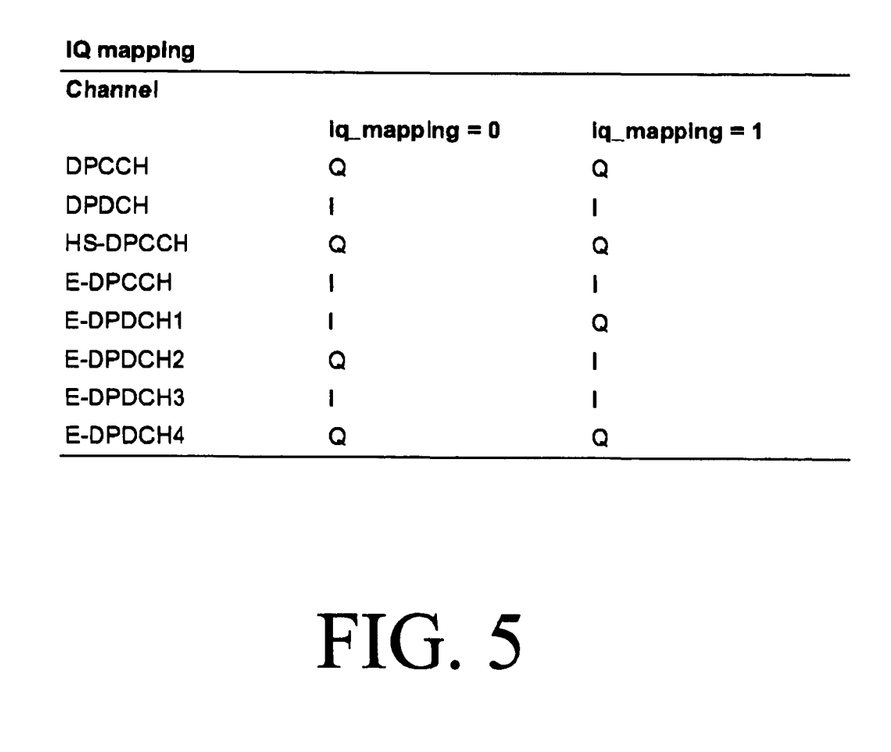
FIG. 5 is a table showing the IQ mapping.

FIG. 5 shows the IQ mapping for all the eight channels 5-12 of the communication system.

The channels mapped to the I combiner 29 and Q combiner 30 are summed together. At the output, preferably, the IQ mapped random signals I+jQ are coded on 14 bits on both I and Q combiners.

In a step 150, the process proceeds with scrambling the IQ mapped random signal I+jQ in scrambling unit 31 by applying a complex-valued scrambling code S=SI+jSQ. The scrambling code S is provided by a scrambling code generator 32. The output of this process is a complex chip stream with the same constellation as the real signal.

The scrambling performed by scrambling unit 31 is equivalent to the one which is performed on the actual data received from the Base Band Transmit (BBTX) and transmitted through the uplink. Specifically, the scrambling code type is fixed in hardware to correspond to a so-called LONG code, and the scrambling code number is set to 0. The scrambling unit is clocked at 4× chip rate (15.36 MHz), similarly to the PN generator chip rate.

In a step 160, the complex chip stream is normalized in order to obtain a constant Root Mean Square (RMS) level independent to the channel weighting configuration.

This is done by multiplying the complex chip stream by a programmable factor K. K is calculated in software from the weighting coefficients, in the same way as for the real signal.

The complex chip stream is multiplied by two multipliers, one for I combiner 29 and Q combiner 30.

Figure 6:
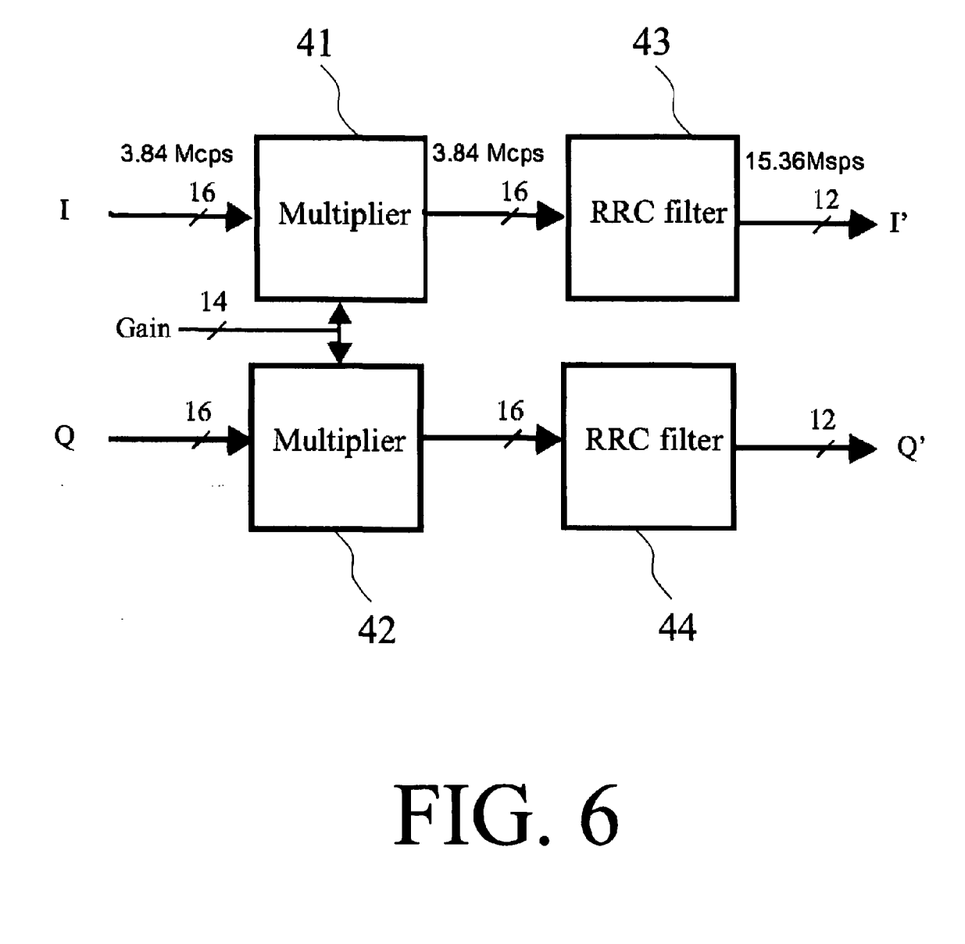
FIG. 6 shows the structure of the multiplying and RRC filtering.

In a step 170, as shown in FIG. 6, the complex chip stream is upsampled by using multipliers 41 and 42 for channels I and Q respectively. Preferably, the complex chip stream is upsampled by four.

After upsampling, the complex chip stream is filtered with a Root-Raised Cosine (RRC) interpolation and pulse shaping filter. Separate and identical RRC filters 43 and 44 are used for I and Q channels respectively while the filter coefficients are the same as the RRC filter for the real signal. The output of the RRC to filtering is I' and Q' channels used in the cubic metric computation step that follows.

The filter is clocked at 16× chip rate (61.44 MHz) which is four times the PN generator chip rate. Preferably the filter output is truncated to 14-bits, and then saturated to 12-bits.

Figure 7:
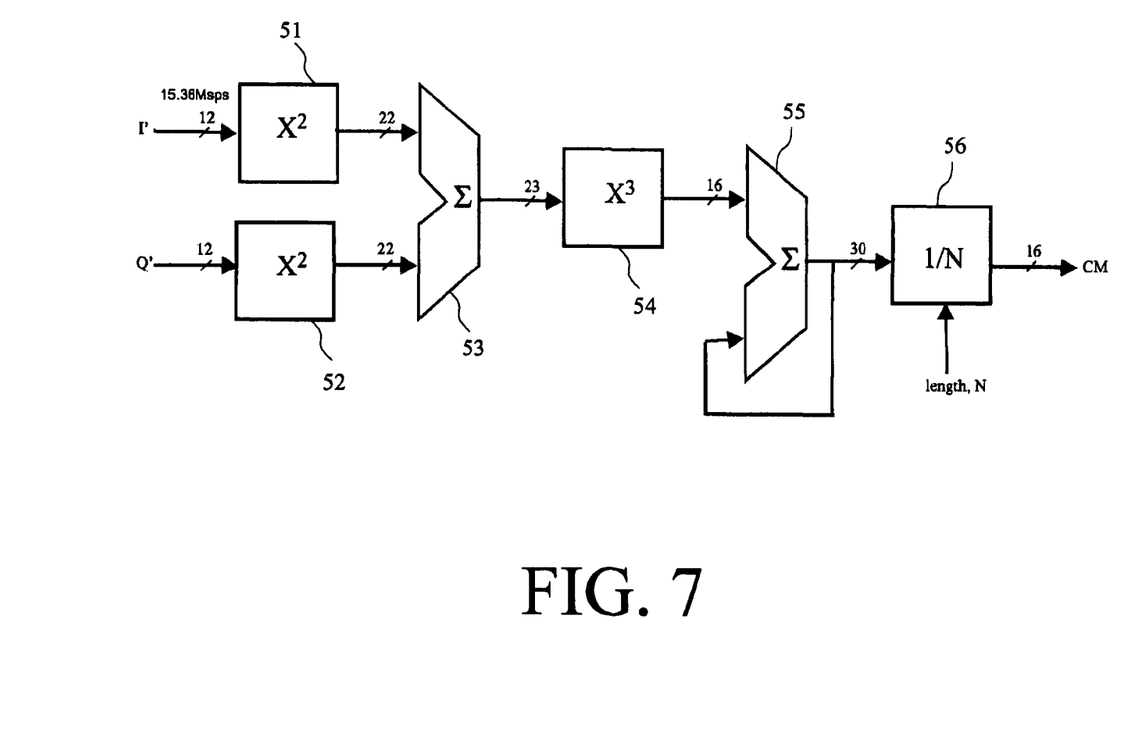
FIG. 7 shows the final step involved in the cubic metric computation.

In a step 180, the Cubic Metric (CM) calculation for the complex chip stream is performed. As shown in FIG. 7 the CM computation firstly comprises a squaring and summation of the I' and Q' channels resulted from the RRC filtering so as to compute $(V_{norm})^3_{RMS}$ where $(V_{norm})_{RMS}$ is the Root Mean Square of a normalized voltage waveform of the complex chip stream.

The squaring of I' and Q' channels is performed by units 51 and 52 respectively while the summation of the squared I' and Q' channels is performed by unit 53. Preferably, in FIG. 7, the output of the squared I' and Q' channels is unsigned so that it can be coded with 22 bits.

After summation, the squared and summed I' and Q' channels, are cubed by using unit 54.

Finally the output of the cube of channels I' and Q' is truncated to 16 bits and channels I' and Q' are averaged. Preferably, during averaging, the maximum accumulation is 1 slot period (2560*4 samples), output on 30 bits. This is then multiplied by ¼N, where N is the accumulation length, set to either 1536 or 2560 chips according to the length field of a Cubic Metric Predictor register.

At the end of the accumulation, the output of the multiplier is 16 Least Significant Bits (LSBs). This output is written into the Cubic Metric (CM) Result register either in the least significant word or in the most significant word, as required by the designer. It should be noticed that the remainder of the cubic metric and MPR calculation is done in software (the described hardware actually only computes $Vnorm^3_{RMS}$.

The invention claimed is:

1. A method for computing cubic metric used for performing Maximum Power Reduction in a transmitter of a user equipment communicating with a base station, said cubic metric computation being performed before each time slot of an uplink transmission of data, said method comprising:
   using pseudorandom number generators for generating random data which are used for performing said cubic metric computation, and
   using the result of said computation for applying said Maximum Power Reduction for each time slot of said uplink transmission;
   wherein the method further comprises
   generating at least one random signal by using the pseudorandom number generators, said random signal being equivalent to a real signal;
   spreading the generated random signal to associated channels;
   weighting the spread random signal by gain factors;
   mapping the weighted random signal to In-phase (I) and Quadrature (Q) channels;
   scrambling the mapped random signal by a complex-valued scrambling code so as to provide a complex chip stream;

normalizing the complex chip stream;
upsampling and filtering the normalized complex chip stream; and
performing Cubic Metric calculation of the normalized complex chip stream, by calculating $(V_{norm})^3{}_{RMS}$;
wherein $(V_{norm})_{RMS}$ is the root mean square of a normalized voltage waveform of the complex chip stream.

2. The method according to claim 1, further comprising applying the Maximum Power Reduction in HSUPA (High-Speed Uplink Packet Access).

3. The method according to claim 1, further comprising applying the Maximum Power Reduction in High-Speed Downlink Packet Access (HSDPA).

4. The method according to claim 1, further comprising applying the Maximum Power Reduction in Long Term Evolution (LTE).

5. A receiver for a user equipment for communicating with a base station in a wireless communication network, said receiver comprising a transmitter that performs cubic metric computation for performing Maximum Power Reduction in said transmitter, said cubic metric computation being performed before each time slot of an uplink transmission of data, said transmitter comprising:
a set of pseudorandom number generators configured to generate random data which are used for performing said cubic metric computation, and
cubic metric computation unit configured to receive the random data generated by said pseudorandom number generators so as to perform the cubic metric computation on said random data which will be used at the next time slot for the transmission to the base station of actual data;

wherein the receiver further comprises
the peudorandom number generators being configured to generate at least one random signal equivalent to a real signal;
modulators configured to spread the generated random signal to associated channels;
weighting units configured to weight the spread random signal by gain factors;
combiners and mapping units configured to map the weighted random signal in In-phase (I) and Quadrature (Q) channels and further configured to scramble the mapped random signal by a complex-valued scrambling code so as to provide a complex chip stream;
the receiver further being configured to normalize the complex chip stream;
multiplier and filters configured to upsample and filter the normalized complex chip stream;
the receiver further being configured for performing a Cubic Metric calculation of the normalized complex chip stream, by calculating $(V_{norm})^3{}_{RMS}$ where $(V_{norm})_{RMS}$ is the root mean square of a normalized voltage waveform of the complex chip stream.

6. The receiver according to claim 5, wherein the Maximum Power Reduction is applied in HSUPA (High-Speed Uplink Packet Access).

7. The receiver according to claim 5, wherein the Maximum Power Reduction is applied in High-Speed Downlink Packet Access (HSDPA).

8. The receiver according to claim 5, wherein the Maximum Power Reduction is applied in Long Term Evolution (LTE).

* * * * *